United States Patent
Wang et al.

(10) Patent No.: US 8,604,548 B2
(45) Date of Patent: Dec. 10, 2013

(54) SEMICONDUCTOR DEVICE HAVING ESD DEVICE

(75) Inventors: Chang-Tzu Wang, Taoyuan County (TW); Mei-Ling Chao, Hsinchu (TW); Chien-Ting Lin, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/304,086

(22) Filed: Nov. 23, 2011

(65) Prior Publication Data

US 2013/0126972 A1 May 23, 2013

(51) Int. Cl.
*H01L 27/12* (2006.01)

(52) U.S. Cl.
USPC .................................. 257/351; 257/E21.703

(58) Field of Classification Search
USPC .................. 257/347, 349, 350, 351, E21.703, 257/E27.112, E29.137
See application file for complete search history.

(56) References Cited

U.S. PATENT DOCUMENTS

| | | | |
|---|---|---|---|
| 5,637,900 A | 6/1997 | Ker et al. | |
| 5,959,820 A | 9/1999 | Ker et al. | |
| 6,043,138 A | 3/2000 | Ibok | |
| 6,492,216 B1 | 12/2002 | Yeo et al. | |
| 6,724,677 B1 | 4/2004 | Su et al. | |
| 6,909,149 B2 | 6/2005 | Russ et al. | |
| 6,921,963 B2 | 7/2005 | Krivokapic et al. | |
| 7,009,252 B2 | 3/2006 | Lin et al. | |
| 7,027,276 B2 | 4/2006 | Chen | |
| 7,087,477 B2 | 8/2006 | Fried et al. | |
| 7,091,551 B1 | 8/2006 | Anderson et al. | |
| 7,205,612 B2 | 4/2007 | Cai et al. | |
| 7,247,887 B2 | 7/2007 | King et al. | |
| 7,250,658 B2 | 7/2007 | Doris et al. | |
| 7,309,626 B2 | 12/2007 | Ieong et al. | |
| 7,352,034 B2 | 4/2008 | Booth, Jr. et al. | |
| 7,368,761 B1 | 5/2008 | Lai et al. | |
| 7,470,570 B2 | 12/2008 | Beintner et al. | |
| 7,531,437 B2 | 5/2009 | Brask et al. | |
| 7,569,857 B2 | 8/2009 | Shaheen et al. | |
| 7,672,100 B2 | 3/2010 | Van Camp | |
| 2003/0076636 A1 | 4/2003 | Ker et al. | |
| 2004/0195624 A1 | 10/2004 | Liu et al. | |

(Continued)

OTHER PUBLICATIONS

K. Okano et al., "Process Integration Technology and Device Characteristics of CMOS FinFET on Bulk Silicon Substrate with sub-10 nm Fin Width and 20nm Gate Length" Electron Devices Meeting, 2005. IEDM Technical Digest. IEEE International, Dec. 2005, pp. 1-4.

*Primary Examiner* — Selim Ahmed
(74) *Attorney, Agent, or Firm* — J.C. Patents

(57) ABSTRACT

A semiconductor device and a fabricating method thereof are provided. The semiconductor device includes a substrate of a first conductivity type, a fin, a gate, source and drain regions of a second conductivity type, and a first doped region of the second conductivity type. A plurality of isolation structures is formed on the substrate. The fin is disposed on the substrate between two adjacent isolation structures. The gate is disposed on the isolation structures and covers a portion of the fin, wherein the portion of the fin covered by the gate is of the first conductivity type. The source and drain regions is configured in the fin at respective sides of the gate. The first doped region is configured in the fin underlying the source and drain regions and adjoining the substrate. The first doped region has an impurity concentration lower than that of the source and drain regions.

10 Claims, 8 Drawing Sheets

(56) References Cited

U.S. PATENT DOCUMENTS

| | | |
|---|---|---|
| 2005/0051825 A1 | 3/2005 | Fujiwara et al. |
| 2006/0099830 A1 | 5/2006 | Walther et al. |
| 2006/0244051 A1* | 11/2006 | Izumida et al. .............. 257/327 |
| 2006/0267102 A1 | 11/2006 | Cheng et al. |
| 2006/0286729 A1 | 12/2006 | Kavalieros et al. |
| 2007/0108528 A1 | 5/2007 | Anderson et al. |
| 2007/0158756 A1 | 7/2007 | Dreeskornfeld et al. |
| 2007/0170509 A1* | 7/2007 | Izumida ........................ 257/353 |
| 2008/0157208 A1 | 7/2008 | Fischer et al. |
| 2009/0072276 A1* | 3/2009 | Inaba ............................ 257/255 |
| 2009/0124097 A1 | 5/2009 | Cheng |
| 2009/0174973 A1 | 7/2009 | Khazhinsky et al. |
| 2009/0242964 A1 | 10/2009 | Akil et al. |
| 2009/0269916 A1 | 10/2009 | Kang et al. |
| 2009/0315112 A1* | 12/2009 | Lee ............................... 257/355 |
| 2010/0048027 A1 | 2/2010 | Cheng et al. |
| 2010/0072553 A1 | 3/2010 | Xu et al. |
| 2010/0144121 A1 | 6/2010 | Chang et al. |
| 2010/0155776 A1 | 6/2010 | Lee |
| 2010/0167506 A1 | 7/2010 | Lin et al. |
| 2010/0296213 A1 | 11/2010 | Lee et al. |

* cited by examiner

SEMICONDUCTOR DEVICE HAVING ESD DEVICE

BACKGROUND OF THE INVENTION

1. Field of the Invention

The present invention relates to a semiconductor device and a method for fabricating the same, and more particularly, to an electrostatic discharge (ESD) protection device and a method for fabricating the same that are compatible with a fin-type field effect transistor (FinFET) process.

2. Description of Related Art

ESD is the main factor of electrical overstress (EOS) which causes damage to most of electronic devices or systems. Such damage can result in the permanent damage of semiconductor devices and computer systems, so that circuit functions of integrated circuits (ICs) are affected and operation of electronic products is abnormal. Accordingly, a number of methods have been developed to protect the semiconductor IC devices against possible ESD damages. The most common type of ESD protection is the incorporation of a specific hardware inside the IC package, and therefore a specially-designed ESD protection device is utmostly required so as to advantageously protect the internal core devices.

SUMMARY OF THE INVENTION

Accordingly, the present invention is directed to a semiconductor device and a method for fabricating the same, wherein an ESD protection device can be compatible with the existing FinFET process.

A semiconductor device of the present invention is provided, including a substrate of a first conductivity type, a first fin, a first gate, a first doped region of the first conductivity type, a second fin, a second gate, and at least one second doped region of the first conductivity type or of the second conductivity type. The substrate includes a first region and a second region. The first fin is disposed on the first region of the substrate, and includes a first middle portion of the first conductivity type, and two first end portions of a second conductivity type. The first gate is disposed on the substrate and covers the first middle portion of the first fin. The first doped region is configured in the first middle portion of the first fin and underlies the first gate, wherein the first doped region has an impurity concentration higher than that of the substrate. The second fin is disposed on the second region of the substrate, and includes a second middle portion of the first conductivity type and two second end portions of the second conductivity type. The second gate is disposed on the substrate and covers the second middle portion of the second fin. The second doped region is configured in the second fin. When the second doped region is of the first conductivity type, the second doped region is configured in the second middle portion of the second fin underlying the second gate, and has an impurity concentration substantially equal to or lower than that of the substrate. When the second doped region is of the second conductivity type, the second doped region is configured in the second end portions of the second fin adjoining the substrate, and has an impurity concentration lower than that of other parts of the second end portions.

According to an embodiment of the present invention, the second doped region of the first conductivity type and the second doped region of the second conductivity type may coexist.

According to an embodiment of the present invention, the semiconductor device further includes a plurality of isolation structures, disposed underneath the first and the second gates and adjacent to the first and the second fins.

According to an embodiment of the present invention, the substrate, the first fin and the second fin are formed of a same material.

According to an embodiment of the present invention, the first region is a core device region, and the second region is an electrostatic discharging (ESD) device region.

Another semiconductor device of the present invention is provided, including a substrate of a first conductivity type, a fin, a gate, source and drain regions of a second conductivity type, and a first doped region of the second conductivity type. A plurality of isolation structures is formed on the substrate. The fin is disposed on the substrate between two adjacent isolation structures. The gate is disposed on the isolation structures and covers a portion of the fin, wherein the portion of the fin covered by the gate is of the first conductivity type. The source and drain regions is configured in the fin at respective sides of the gate. The first doped region is configured in the fin underlying the source and drain regions and adjoining the substrate. The first doped region has an impurity concentration lower than that of the source and drain regions.

According to an embodiment of the present invention, the semiconductor device further includes a second doped region of the first conductivity type, configured in the fin underlying the gate and between the source and drain regions. The second doped region has an impurity concentration substantially equal to or lower than that of the substrate.

According to an embodiment of the present invention, the substrate and the fin are formed of a same material.

A method for fabricating a semiconductor device of the present invention is described as follows. A fin of a first conductivity type is formed on a substrate of the first conductivity type. A gate is formed on the substrate, wherein the gate covers a portion of the fin. Source and drain regions of a second conductivity type are formed in the fin at respective sides of the gate. A punch-through stopper (PTS) of the first conductivity type is formed in the fin underlying the gate and between the source and drain regions, wherein the PTS has an impurity concentration higher than that of the substrate. A first impurity of the second conductivity type is implanted into the PTS, so as to compensate the impurity concentration of the PTS.

According to an embodiment of the present invention, the method further includes implanting a second impurity of the first conductivity type into a bottom part of the source and drain regions, so as to compensate an impurity concentration of the bottom part of the source and drain regions.

Another method for fabricating a semiconductor device of the present invention is described as follows. A fin of a first conductivity type is formed on a substrate of the first conductivity type. A gate is formed on the substrate, wherein the gate covers a portion of the fin. Source and drain regions of a second conductivity type are formed in the fin at respective sides of the gate. An impurity of the first conductivity type is implanted into a bottom part of the source and drain regions, so as to compensate an impurity concentration of the bottom part of the source and drain regions.

According to an embodiment of the present invention, a punch-through stopper (PTS) is not formed in the fin underlying the gate and between the source and drain regions.

According to an embodiment of the present invention, when the first conductivity type is P-type, the second conductivity is N-type; when the first conductivity type is N-type, the second conductivity is P-type.

As mentioned above, in the semiconductor device and the method for fabricating the same of the present invention, the proposed doped regions can induce punch-through currents more easily at respective junctions, so as to provide possible current leakage paths for ESD purposes. Besides, the fabricating method is entirely compatible with the current FinFET process, such that the fabrication is simple and the ESD performance can be improved.

In order to make the aforementioned and other features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
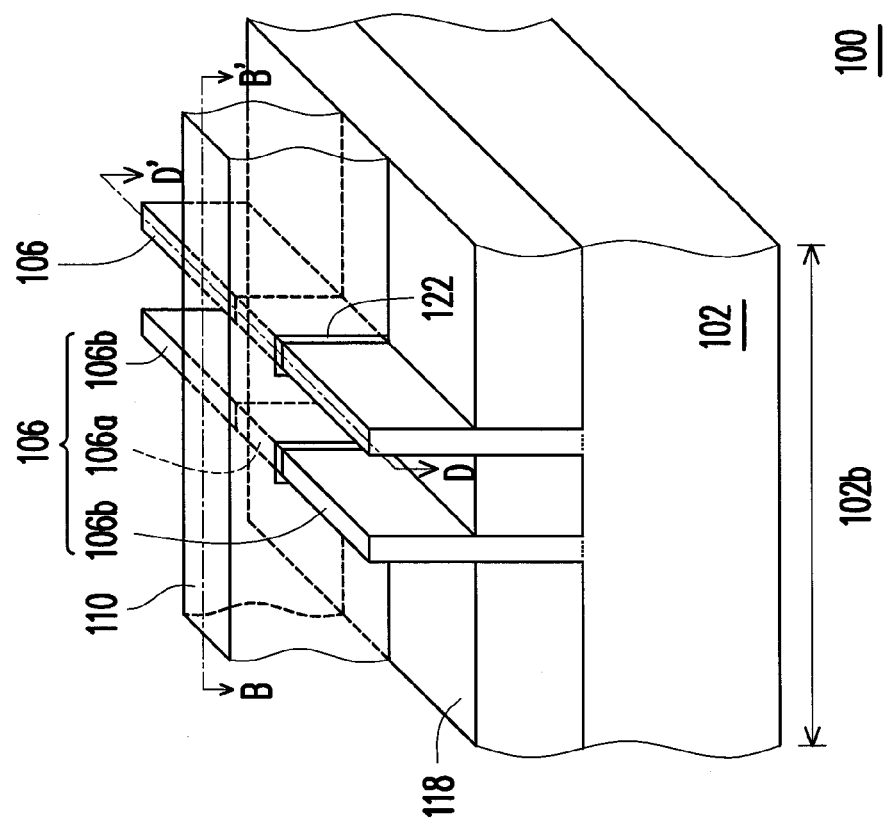
FIG. 1 depicts, in a simplified perspective view, a semiconductor device according to an embodiment of the present invention.
Figure 1:
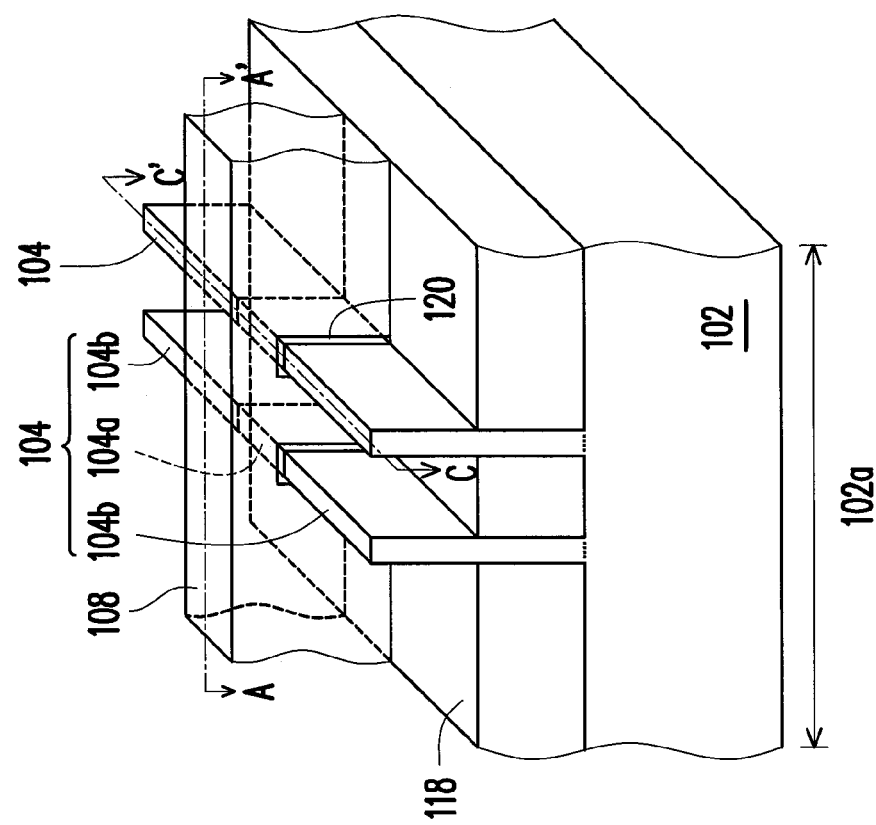

Reference will now be made in detail to the present preferred embodiments of the invention, examples of which are illustrated in the accompanying drawings. Wherever possible, the same reference numbers are used in the drawings and the description to refer to the same or like parts.

In a FinFET, one or multiple fins are formed by vertically extending from a substrate, and a gate intersects these fins. A source and a drain are formed at respective ends of each fin, and an effective channel determined by a contact region of each fin and the gate is formed therebetween. As compared with a planar transistor, the FinFET has an increased channel width, and thus, a higher drive current can be obtained with a less chip area in an integrated circuit.

As devices are continuously miniaturized and compactly integrated, demand for reducing the line width of the fins is raised, so that conventional PESD technique applied at the drain side for lowering breakdown voltage and discharging ESD currents is no longer suitable for the FinFET construction due to the narrowing fins. Accordingly, an ESD protection device and a fabricating method thereof that can be compatible with the FinFET process are illustrated in the following embodiments according to the present invention. For illustration purposes, the following disclosure is described in terms of a core device and an ESD protection device incorporated on a single substrate, which are illustrated only as an exemplary example, and should not be adopted for limiting the scope of the present invention. The number and the arrangement of the fins are not particularly limited by the present invention.

FIG. 1 depicts, in a simplified perspective view, a semiconductor device according to an embodiment of the present invention. FIGS. 2A-2D are schematic cross-sectional diagrams of the semiconductor device shown in FIG. 1 along respective lines A-A', B-B', C-C' and D-D'. Referring to FIG. 1 and FIGS. 2A-2D, a semiconductor device 100 includes a substrate 102 of a first conductivity type, fins 104 and 106, gates 108 and 110, doped regions 112 of the first conductivity type, and at least one of doped regions 114 of the first conductivity type and doped regions 116 of the second conductivity type.

The substrate 102 includes a first region 102a and a second region 102b which are, for example, separated from each other. In an embodiment, the first region 102a may be a core device region, and the second region 102b may be an ESD protection device region. The substrate 102 can be a P-type bulk semiconductor wafer made of material selected from the group consisting of silicon (Si), germanium-doped silicon (Ge-doped Si), carbon-doped silicon (C-doped Si), SiGe, germanium (Ge), and III-V semiconductors such as GaAs, InGaAs, InSb, InAs, GaSb, InP, etc. In an embodiment, the substrate 102 is a P-- or P- substrate.

A plurality of isolation structures 118, e.g. shallow trench isolation (STI), is deployed on the substrate 102. The isolation structures 118 can be disposed underneath the gates 108 and 110, and also adjacent to the fins 104 and 106. The isolation structures 118 are, for example, made of insulating material such as silicon oxide.

Figure 2A:
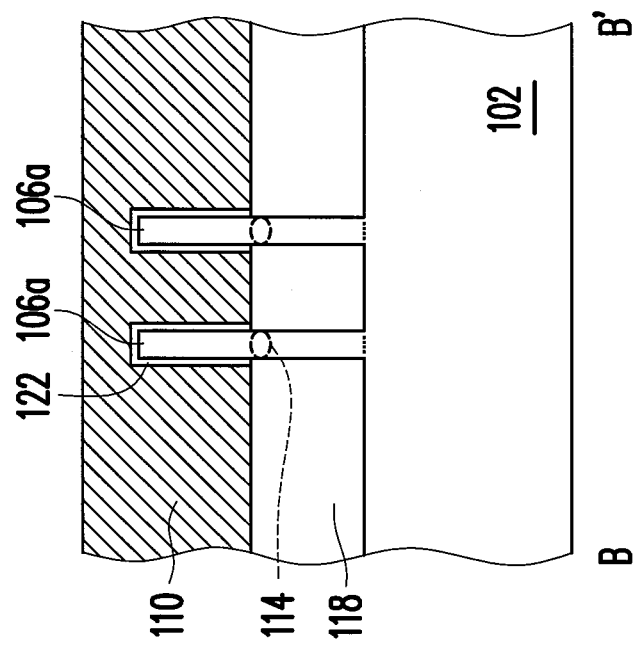
FIGS. 2A-2D are schematic cross-sectional diagrams of the semiconductor device shown in FIG. 1 along respective lines A-A', B-B', C-C' and D-D'.
Figure 2B:
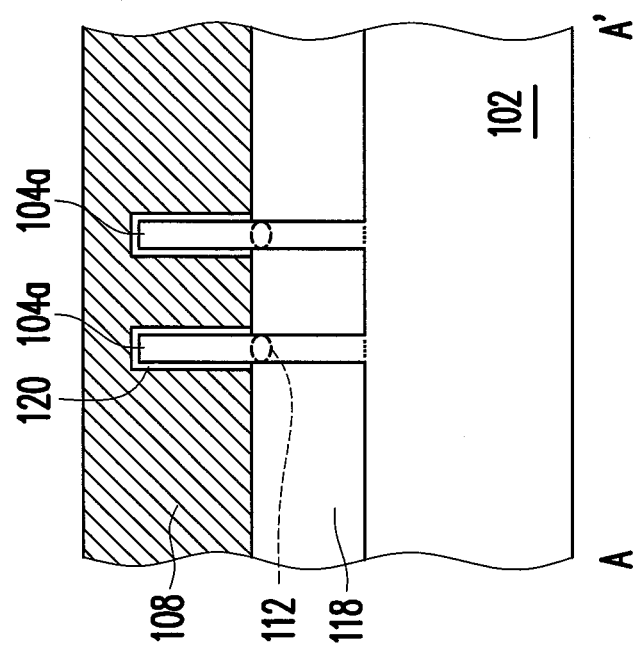
Figure 2D:
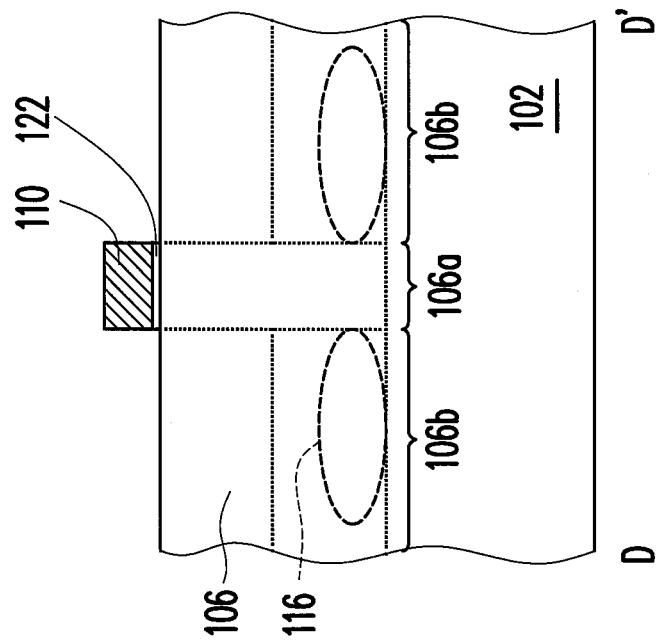
Figure 2C:
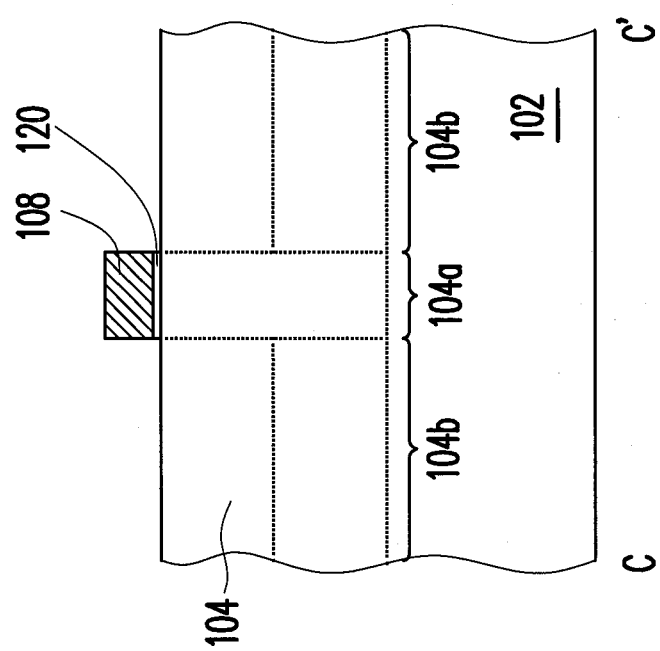

Referring to FIGS. 1, 2A and 2C, the fins 104 are disposed on the first region 102a of the substrate 102, and each fin 104 includes a middle portion 104a of the first conductivity type and two end portions 104b of a second conductivity type. The fins 104 and the substrate 102 can be formed of the same material. In an embodiment, the doping conditions of the middle portions 104a of the fins 104 can be the same as the P-- or P- substrate 102. In an embodiment, the end portions 104b of the fins 104 can be doped as N+ regions.

The gate 108 is disposed on the substrate 102 and covers the middle portions 104a of the fins 104. The gate 108 may have a stripe pattern extending along a direction different from the extending direction of the fins 104, and thus, the gate 108 intersects the fins 104 and the isolation structures 118. In addition, a gate dielectric layer 120 may be disposed between the gate 108 and the fins 104, wherein the gate dielectric layer can be arranged or formed based on requirements of the practical manufacture. The P-type lightly doped middle portions 104a covered by the gate 108 may serve as channel regions in the transistors, while the N-type heavily doped end portions 104b at respective sides of the gate 108 may serve as source and drain regions. The material of the gate 108 includes polysilicon, metal, alloy, metal silicide or a combination thereof.

The doped regions 112 are configured in the middle portions 104a of the fins 104, and underlie the gate 108. As shown in FIG. 2A, the doped regions 112 may be substantially level with the top surfaces of the isolation structures 118, and therefore, approximately beneath the channel regions between the source and drain regions. The doped regions 112, such as P- or P doped regions, have an impurity concentration higher than that of the substrate 102.

Since punch-through currents (leakage currents) may flow easily in regions not controlled by the gate, an ion implantation is performed to dope these regions with the impurity having a conductivity type opposite to that of the source and drain regions and to a high impurity concentration, so as to reduce the punch-through currents. In other words, the doped regions 112 with the impurity concentration higher than that of the substrate 102 can function as a punch-through stopper (PTS) to efficiently suppress the leakage currents beneath the channel regions embedded in the isolation structures 118. Hence, owing to the PTS, the off-leakage issue between the source and drain regions can be favorably solved in the FinFET core device.

Referring to FIGS. 1, 2B and 2D, the fins 106 are disposed on the second region 102b of the substrate 102, and each fin 106 includes a middle portion 106a of the first conductivity type and two end portions 106b of the second conductivity type. Likewise, the fins 106 and the substrate 102 can be formed of the same material. In an embodiment, the doping conditions of the middle portions 106a of the fins 106 can be the same as the P-- or P- substrate 102. In an embodiment, the end portions 106b of the fins 106 can be doped as N+ regions.

The gate 110 is disposed on the substrate 102 and covers the middle portions 106a of the fins 106. Similar to the disposition of the gate 108 on the first region 102a of the substrate 102, the gate 110 deployed on the second region 102b of the substrate 102 may intersect the fins 106 and the isolation structures 118. A gate dielectric layer 122 may be further disposed between the gate 110 and the fins 106. It is noted that the P-type lightly doped middle portions 106a covered by the gate 110 may serve as channel regions, while the N-type heavily doped end portions 106b at respective sides of the gate 110 may serve as source and drain regions. The gate 110 can be made of the same or like materials of the gate 108, and detailed descriptions thereof are omitted herein.

The doped regions 114 of the first conductivity type and the doped regions 116 of the second conductivity type are configured in different sites of the fins 106. In an embodiment, the semiconductor device 100 can include the doped regions 114 in the fins 106 solely, or can include the doped regions 116 in the fins 106 solely. In an alternative embodiment, the doped regions 114 and the doped regions 116 can coexist in the fins 106 of the semiconductor device 100.

As shown in FIG. 2B, the P-type doped regions 114 are configured in the middle portions 106a of the fins 106 underlying the gate 110. The deployment of the doped regions 114 on the second region 102b of the substrate 102 may corresponds with that of the doped regions 112 on the first region 102a of the substrate 102, while the difference therebetween lies in the impurity concentration. In an embodiment, the doped regions 114, such as P-- or P- doped regions, have an impurity concentration substantially equal to or lower than that of the substrate 102.

As shown in FIG. 2D, the N-type doped regions 116 are configured in the end portions 106b of the fins 106 adjoining the substrate 102. The doped regions 116 are, for example, deployed in bottom parts of the end portions 106b. That is to say, the end portions 106b of the fins 106 can be divided into two parts respectively, wherein the doped regions 116 is configured at the bottom adjoining the substrate 102, and the other part above the doped regions 116 functions as the source and drain regions. In an embodiment, the doped regions 116, such as N or N- doped regions, have an impurity concentration lower than that of the source and drain regions (i.e. the other part above the doped regions 116).

It should be noticed that, in the ESD protection device, the P-type doped regions 114 lighter than the substrate 102 and/or the N-type doped regions 116 lighter than the source and drain regions can facilely induce leakage currents at respective junctions, thereby providing possible punch-through current paths for ESD protection purposes. In detail, as opposite to the doped regions 112 (i.e. PTS) in the core device, the lighter P-type doped regions 114 underlying the channel regions is prone to cause large off-leakage currents between the source and drain regions, and such behavior facilitates bypass of the ESD currents. In another aspect, the lighter N-type doped regions 116 underlying the source and drain regions and adjoining the substrate 102 is also capable of encouraging the punch-through phenomenon, and thus the sudden ESD currents can be discharged downward.

Moreover, the coexistence of the P-type doped regions 114 and the N-type doped regions 116 can further advance the current spreading as the ESD current conduction area is uniformly spread out, so that much higher ESD currents can be conducted and discharged. The substrate potential may be raised through the current leakage paths induced by the doped regions 114 and 116, and therefore, the bipolar junction transistor (BJT) can be quickly turned on with uniformly turn-on behavior. Accordingly, the ESD protection capability is effectively improved in this ESD protection device based on the FinFET construction, and the core FinFET device or other internal circuits can thus be advantageously protected.

A method for fabricating the semiconductor device 100 shown in FIG. 1 is then illustrated in a perspective view. For illustration purposes, the following disclosure of semiconductor device manufacture is mainly described in terms of utilizing the existing FinFET process to form the ESD protection device in this invention, which thereby enables those of ordinary skill in the art to practice this invention, but is not construed as limiting the scope of this invention. It is appreciated by those of ordinary skill in the art that other elements can be formed in a manner or in sequence not shown in the following embodiment according to known knowledge in the art.

FIGS. 3A-3E schematically depict, in a perspective view, a method for fabricating a semiconductor device according to an embodiment of the present invention, wherein the detailed descriptions of the same or like elements shown in FIG. 1 and FIGS. 2A-2D have been described explicitly in the foregoing embodiment, and will be omitted hereinafter. In order to clearly illustrate the fabrication procedure, the drawings of FIGS. 3A-3E may be simplified by omitting partial structures.

Figure 3A:
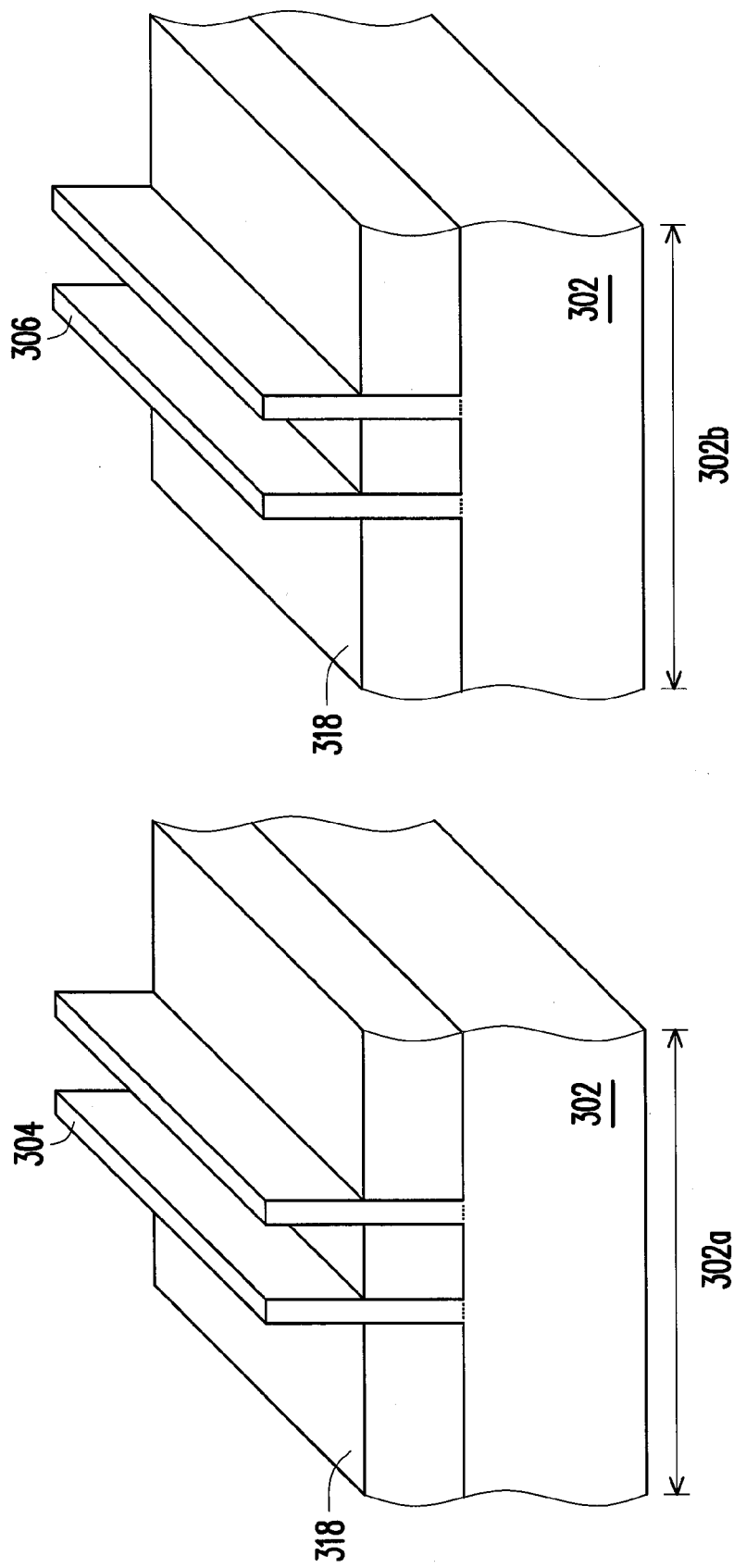
FIGS. 3A-3E schematically depict, in a perspective view, a method for fabricating a semiconductor device according to an embodiment of the present invention.

Referring to FIG. 3A, a substrate 302 is provided, which includes a first region 302a and a second region 302b such as a core device region and an ESD protection device region. The substrate 302 can be a P-type bulk semiconductor wafer, but the present invention is not limited thereto. The substrate 302 is then patterned by lithography and etching processes, so that a plurality of P-type fins 304 and 306 are formed by respectively protruding from the first region 302a and the second region 302b of the substrate 302. Isolation structures 318 are formed between the adjacent fins 304 and between the adjacent fins 306, wherein top surfaces of the isolation structures 318 are, for example, lower than those of the fins 304 and 306.

Figure 3B:
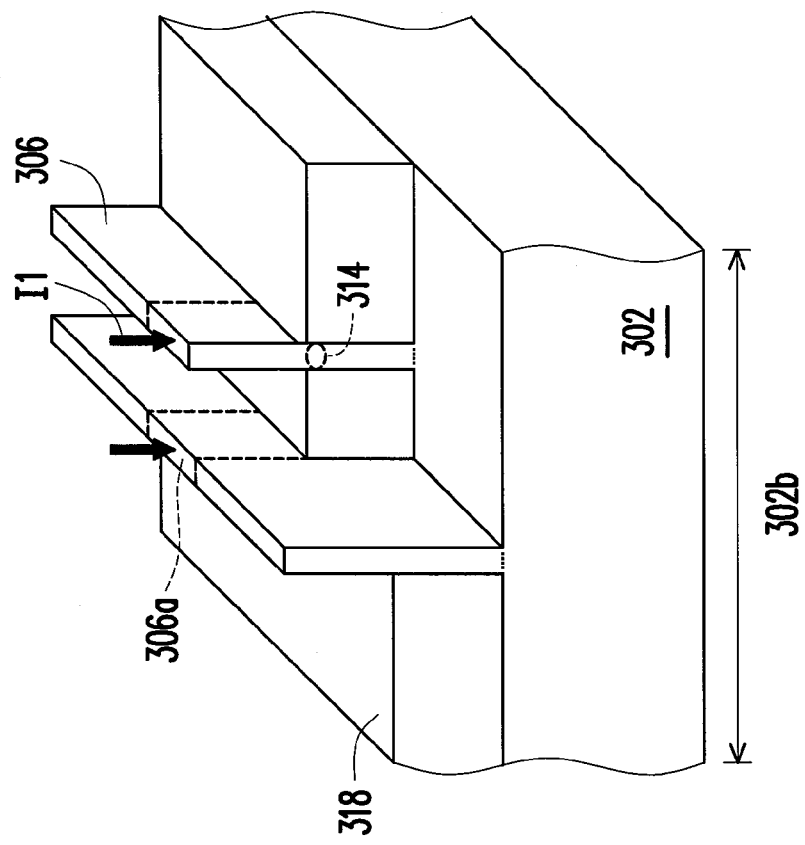
Figure 3B:
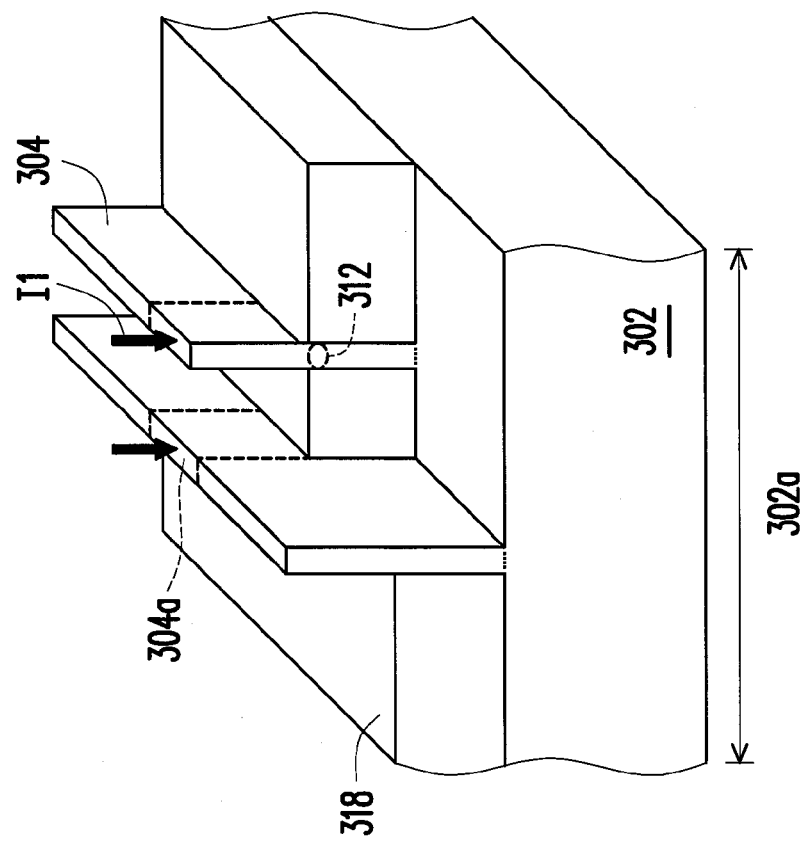

Referring to FIG. 3B, an ion implantation I1 is performed to partially dope middle portions 304a of the fins 304 and middle portions 306a of the fins 306 with the impurity having the same conductivity type as the substrate 302, i.e. P-type impurity. An optional annealing treatment can be further performed after the ion implantation I1. Doped regions 312 and 314 are thus formed by implanting the P-type impurity therein, and have an impurity concentration higher than that of the substrate 302. In an embodiment, the doped regions 312 and 314 may be substantially level with the top surfaces of the isolation structures 318 and approximately beneath channel regions to be subsequently formed, that is, in positions analogous to the doped regions 112 and 114 shown in FIGS. 2A-2B. The P-type doped regions 312 and 314 with higher impurity concentration may serve as a punch-through stopper (PTS), thereby reducing the punch-through currents.

Figure 3C:
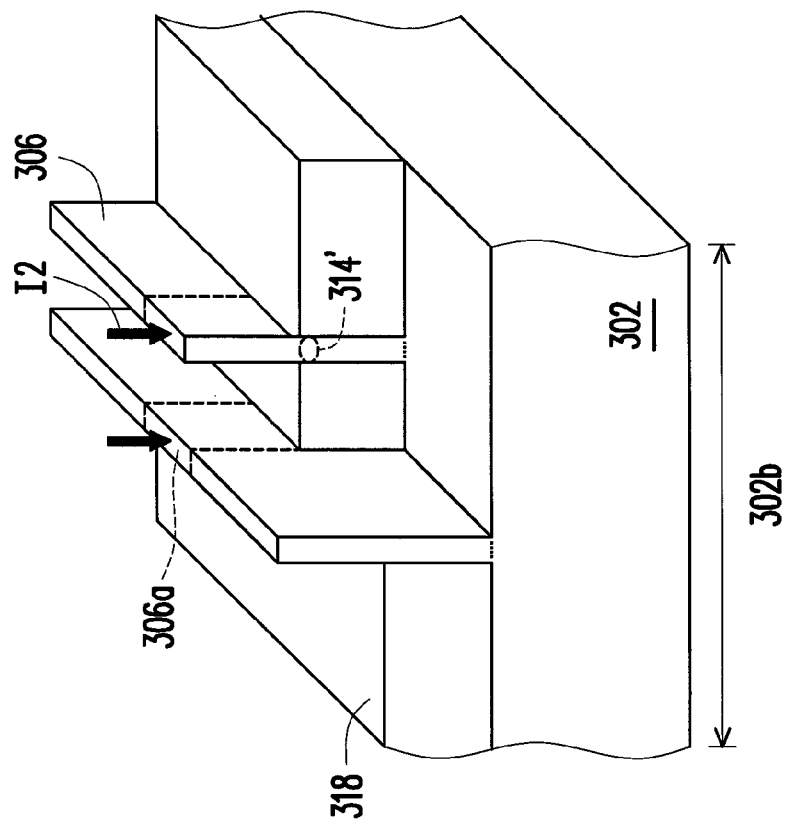
Figure 3C:
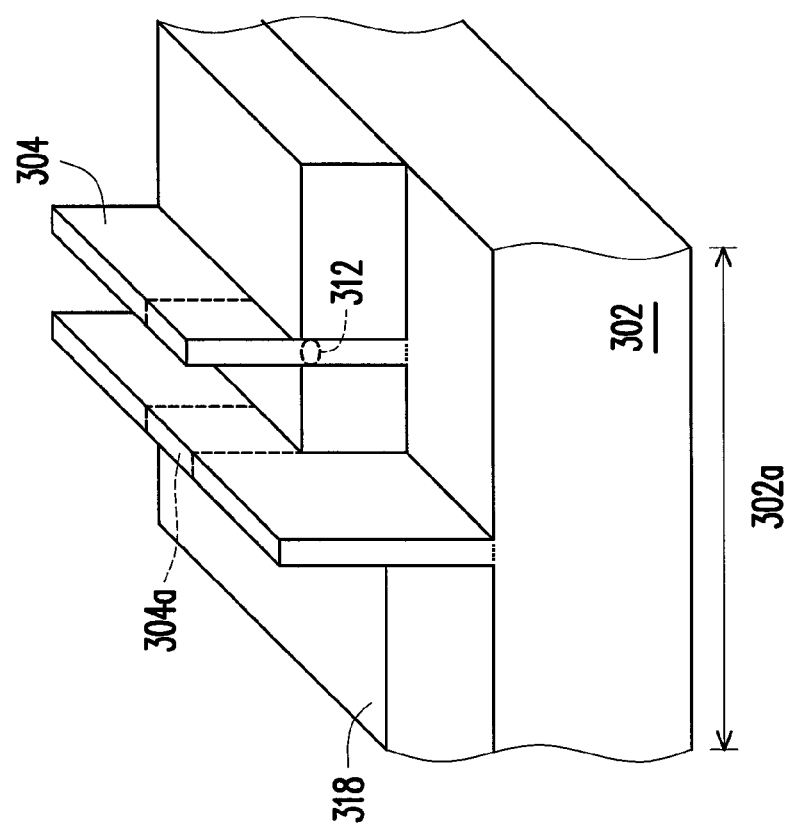

Referring to FIG. 3C, another ion implantation I2 is performed to dope the doped regions 314 with an impurity having a conductivity type opposite to that of the substrate 302, i.e. N-type impurity. Another annealing treatment can be optionally performed after the ion implantation I2. After conducting the ion implantation I2, the original P-type impurity in the doped regions 314' is compensated by the N-type impurity, and thus the P-type impurity concentration of the doped regions 314' may be substantially equal or lower than that of the substrate 302. Consequently, the resultant doped regions 314' are deprived of the PTS function, and such default adjustment turns the former PTS into a possible conducting path for ESD currents in the second region (ESD protection device region) 302b.

Figure 3D:
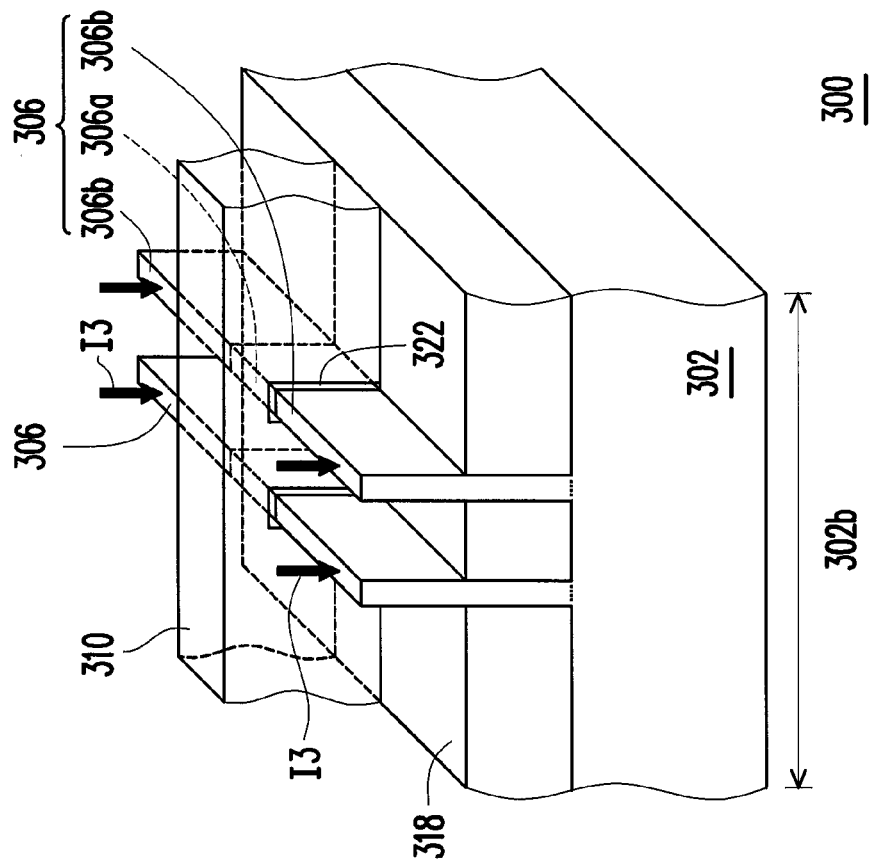
Figure 3D:
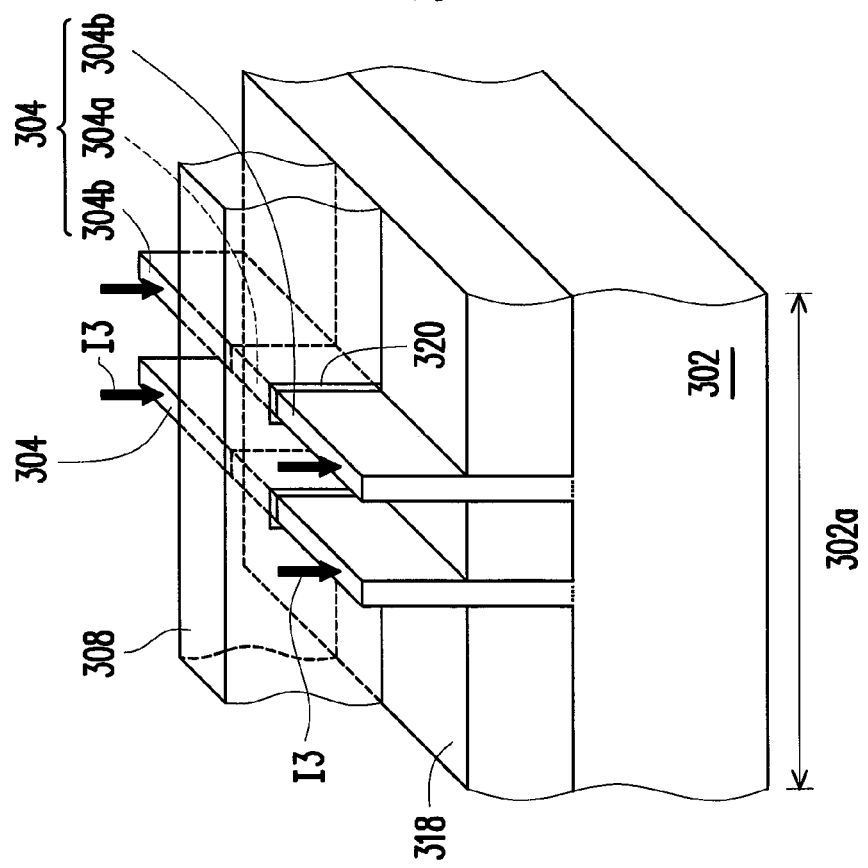

Referring to FIG. 3D, gates 308 and 310 are formed on the substrate 304 to cover portions of the fins 304, 306 and the isolation structures 318. The gate 308 covers the middle portions 304a of the fins 304 in the first region 302a, and the gate 310 covers the middle portions 306a of the fins 306 in the second region 302b, such that the channel regions are defined. In an embodiment, a gate dielectric layer 320 may be formed between the gate 308 and the fins 304, and a gate dielectric layer 322 may be formed between the gate 310 and the fins 306.

Afterwards, an ion implantation process I3 can be performed, thereby forming source and drain regions in the fins 304 and 306 at respective sides of the gates 308 and 310. In this embodiment, N-type impurity is implanted into end portions 304b of the fins 304 and into end portions 306b of the fins 306 using the gates 308 and 310 as a mask, so that N+ doped regions are formed. Another annealing treatment can be performed after the ion implantation I3 for implant activation.

Figure 3E:
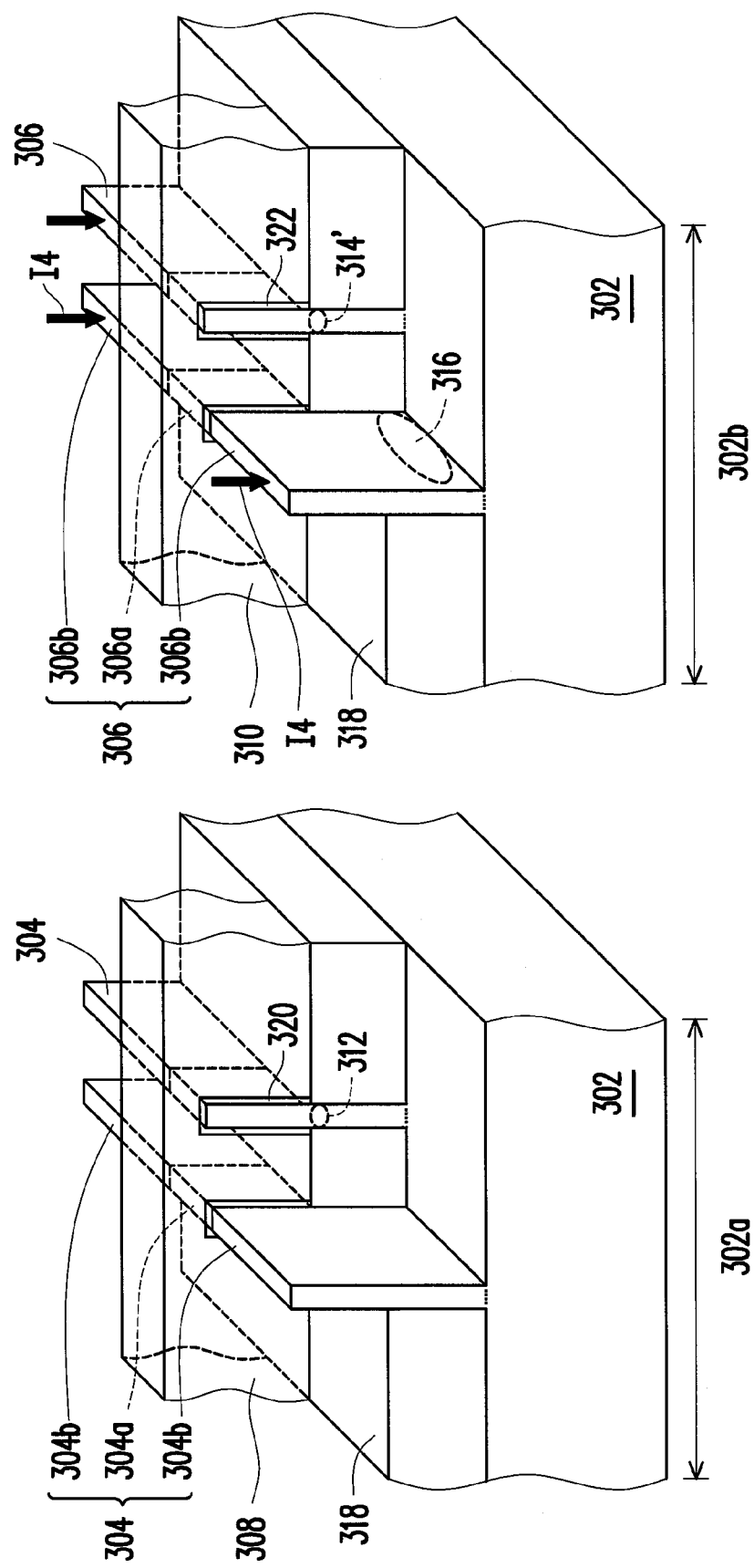

Referring to FIG. 3E, another ion implantation I4 is performed to dope bottom parts of the end portions 306b of the fins 306 with an impurity having a conductivity type opposite to that of the source and drain regions, i.e. P-type impurity. Likewise, an annealing treatment can be additionally conducted after the ion implantation I4. The ion implantation I4 enables the bottom parts of the N+ source and drain regions adjoining the substrate 302 to be compensated with the P-type impurity, so that doped regions 316 are formed at the junction between the substrates 302 and the source and drain regions of the ESD protection device, and have an impurity concentration lower than that of the source and drain regions. Hence, the fabrication of the demanded semiconductor device 100 shown in FIG. 1 is accomplished in substance.

It should be mentioned that the ion implantations I1, I2 and I4 are selectable based on requirements of the doped regions 314' and 316. In practice, the doped regions 314' and 316 can coexist or, in the alternative, the formation of the doped regions 314' or the doped regions 316 can be omitted. Consequently, the doped regions 314' and/or the doped regions 316 formed in the second region (ESD protection device region) 302b may function as the punch-through current paths for ESD protection, and eventually provide better ESD conduction efficiency. In addition, any combination of these ion implantations and annealing treatments required in the fabricating process can be incorporated and compatible with the existing FinFET fabrication process.

Moreover, the formation of the doped regions 314' that are fabricated by compensating the P-type impurity in the PTS (doped regions 314) according to the above-mentioned embodiment is only as an exemplary example, and should not be adopted for limiting the scope of the present invention. In another embodiment, only the doped regions 312 are formed as the PTS underlying the gate 308 and between the source and drain regions in the first region (core device region) 302a, while the doped regions 314 are not formed in the second region (ESD protection device region) 302b. Since the ESD protection device is free of the PTS (doped regions 314) in the fins 306 underlying the gate 310, the compensation for the PTS is no longer necessary.

It is noticed that the foregoing embodiments in which the first conductivity type is P-type and the second conductivity type is N-type are provided for exemplary illustration purposes, and should not be construed as limiting the scope of the present invention. It is appreciated by those skilled in the art that the conductivity type depicted above can be exchanged, i.e. the first conductivity type being N-type and the second conductivity type being P-type, so as to form the semiconductor device in other embodiments of this invention. Other applications and modifications should be apparent to those of ordinary skill in the art in accordance with the said embodiments, and thus, the detailed descriptions thereof are not specifically described herein.

In view of the above, the semiconductor device and the fabricating method thereof according to several embodiments described above provide the current leakage paths by tuning or removing the implantation of the PTS, thereby facilitating the punch-through phenomenon at the junctions. Hence, the ESD currents can be easily conducted and discharged, and the core device or other internal circuits can thus be well protected. Further, the method of the present invention can be in general compatible with and incorporated into the current FinFET process through slight modifications. Therefore, not only the ESD performance can be promised, but the fabrication process is simplified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
   a substrate of a first conductivity type, comprising a first region and a second region;
   a first fin, disposed on the first region of the substrate, and comprising a first middle portion of the first conductivity type and two first end portions of a second conductivity type;
   a first gate, disposed on the substrate and covering the first middle portion of the first fin;
   a first doped region of the first conductivity type, configured in the first middle portion of the first fin and underlying the first gate, wherein the first doped region has an impurity concentration higher than an impurity concentration of the substrate;
   a second fin, disposed on the second region of the substrate, and comprising a second middle portion of the first conductivity type and two second end portions of the second conductivity type;
   a second gate, disposed on the substrate and covering the second middle portion of the second fin; and
   at least one second doped region of the first conductivity type or of the second conductivity type, configured in the second fin,
   wherein when the second doped region is of the first conductivity type, the second doped region is configured in the second middle portion of the second fin underlying the second gate, and has an impurity concentration substantially equal to or lower than the impurity concentration of the substrate, and
   when the second doped region is of the second conductivity type, the second doped region is configured in the two second end portions of the second fin adjoining the substrate, and has an impurity concentration lower than an impurity concentration of other parts of the two second end portions.

2. The semiconductor device according to claim 1, wherein the second doped region of the first conductivity type and the second doped region of the second conductivity type coexist.

3. The semiconductor device according to claim 1, further comprising a plurality of isolation structures disposed underneath the first gate and the second gate, and adjacent to the first fin and the second fin.

4. The semiconductor device according to claim 1, wherein the substrate, the first fin and the second fin are formed of a same material.

5. The semiconductor device according to claim 1, wherein the first region is a core device region, and the second region is an electrostatic discharging (ESD) device region.

6. The semiconductor device according to claim 1, wherein when the first conductivity type is P-type, the second conductivity is N-type; when the first conductivity type is N-type, the second conductivity is P-type.

7. A semiconductor device, comprising:
a substrate of a first conductivity type, on which a plurality of isolation structures is formed;
a fin, disposed on the substrate between two adjacent isolation structures;
a gate, disposed on the isolation structures and covering a portion of the fin, wherein the portion of the fin covered by the gate is of the first conductivity type;
source and drain regions of a second conductivity type, configured in the fin at respective sides of the gate; and
a first doped region of the second conductivity type, configured in the bottom part of the fin underlying the source and drain regions and adjoining the substrate,
wherein the first doped region has an impurity concentration lower than an impurity concentration of the source and drain regions.

8. The semiconductor device according to claim 7, further comprising a second doped region of the first conductivity type, configured in the fin underlying the gate and between the source and drain regions, wherein the second doped region has an impurity concentration substantially equal to or lower than an impurity concentration of the substrate.

9. The semiconductor device according to claim 7, wherein the substrate and the fin are formed of a same material.

10. The semiconductor device according to claim 7, wherein when the first conductivity type is P-type, the second conductivity is N-type; when the first conductivity type is N-type, the second conductivity is P-type.

* * * * *